US007851720B2

(12) United States Patent
Raunig

(10) Patent No.: US 7,851,720 B2
(45) Date of Patent: Dec. 14, 2010

(54) CAPACITIVE TOUCH SWITCH, CIRCUIT CONFIGURATION FOR A CAPACITIVE TOUCH SWITCH AND CONTROL DEVICE FOR AN ELECTRONIC DOMESTIC APPLIANCE WITH AT LEAST ONE CAPACITIVE TOUCH SWITCH

(75) Inventor: Bernd Raunig, Berlin (DE)

(73) Assignee: Diehl Ako Stiftung & Co. KG, Wangen (DE)

( * ) Notice: Subject to any disclaimer, the term of this patent is extended or adjusted under 35 U.S.C. 154(b) by 993 days.

(21) Appl. No.: 11/698,812

(22) Filed: Jan. 26, 2007

(65) Prior Publication Data
US 2007/0181412 A1 Aug. 9, 2007

(30) Foreign Application Priority Data
Feb. 6, 2006 (DE) .................. 10 2006 005 581

(51) Int. Cl.
*H03K 17/975* (2006.01)
(52) U.S. Cl. ................ 200/600; 341/33; 345/173
(58) Field of Classification Search ............. 200/600; 341/22, 33, 34; 345/168, 169, 173, 176
See application file for complete search history.

(56) References Cited

U.S. PATENT DOCUMENTS

| | | | | |
|---|---|---|---|---|
| 3,958,239 A * | 5/1976 | Green | ............... | 341/24 |
| 4,090,092 A * | 5/1978 | Serrano | ............... | 200/600 |
| 4,176,575 A * | 12/1979 | Munch | ............... | 84/679 |
| 4,237,421 A | 12/1980 | Waldron | | |
| 4,290,061 A * | 9/1981 | Serrano | ............... | 345/174 |
| 4,380,040 A * | 4/1983 | Posset | ............... | 200/600 |
| 4,831,279 A | 5/1989 | Ingraham | | |
| 5,760,715 A * | 6/1998 | Senk et al. | ............... | 341/33 |
| 5,917,165 A * | 6/1999 | Platt et al. | ............... | 200/600 |
| 5,973,417 A * | 10/1999 | Goetz et al. | ............... | 307/129 |
| 6,657,616 B2 * | 12/2003 | Sims | ............... | 345/173 |
| 6,667,563 B2 * | 12/2003 | Bae et al. | ............... | 307/112 |
| 6,958,459 B2 | 10/2005 | Engelmann | | |
| 7,154,393 B2 * | 12/2006 | Okushima et al. | ............ | 340/562 |

(Continued)

FOREIGN PATENT DOCUMENTS

DE 2942097 A1 5/1980

(Continued)

*Primary Examiner*—Michael A. Friedhofer
(74) *Attorney, Agent, or Firm*—Laurence A. Greenberg; Werner H. Stemer; Ralph E. Locher

(57) ABSTRACT

A capacitive touch switch which is used, for example, in a control device for an electronic domestic appliance, includes a sensor area as part of a capacitive sensor element having a capacitance which changes when touched. A measuring electrode, which is coupled to the sensor area, is disposed on a printed circuit board and is at a first potential. An additional electrode, which is disposed near the measuring electrode, likewise on the printed circuit board, is electrically insulated from the measuring electrode and is at a second potential, which is different from the first potential. The additional electrode brings about a shielding of the measuring electrode and thus an output signal of an associated sensor circuit that is less sensitive to interference. A circuit configuration for a capacitive touch switch and a control device for an electronic domestic appliance, are also provided.

13 Claims, 3 Drawing Sheets

U.S. PATENT DOCUMENTS 7,185,999 B2 * 3/2007 Lui .................... 362/157
7,394,458 B2 * 7/2008 Lyon et al. ............ 345/173

FOREIGN PATENT DOCUMENTS

| DE | 37 30 899 C1 | 10/1988 |
| DE | 197 01 899 A1 | 10/1997 |
| DE | 197 27 220 A1 | 1/1999 |
| DE | 103 20 548 A1 | 12/2004 |
| EP | 0262909 A2 | 4/1988 |
| EP | 0 858 166 A1 | 8/1998 |
| WO | 2007025851 A1 | 3/2007 |

* cited by examiner

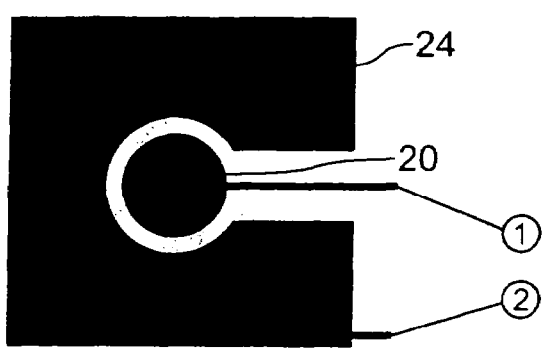
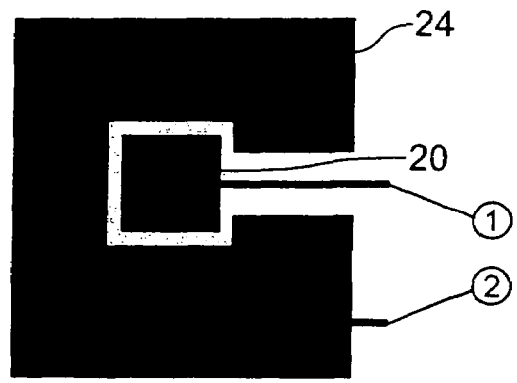
Fig. 4            Fig. 5
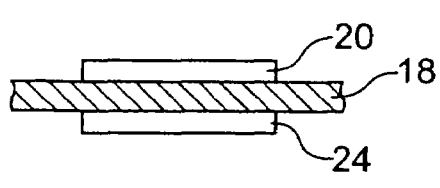
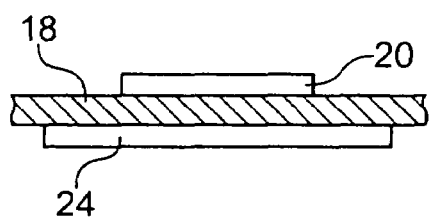
Fig. 6            Fig. 7

CAPACITIVE TOUCH SWITCH, CIRCUIT CONFIGURATION FOR A CAPACITIVE TOUCH SWITCH AND CONTROL DEVICE FOR AN ELECTRONIC DOMESTIC APPLIANCE WITH AT LEAST ONE CAPACITIVE TOUCH SWITCH

CROSS-REFERENCE TO RELATED APPLICATION

This application claims the priority, under 35 U.S.C. §119, of German Patent Application DE 10 2006 005 581.0, filed Feb. 6, 2006; the prior application is herewith incorporated by reference in its entirety.

BACKGROUND OF THE INVENTION

Field of the Invention

The present invention relates to a capacitive touch switch including a sensor area as part of a capacitive sensor element having a capacitance which changes when touched, and a measuring electrode which is coupled to the sensor area, is disposed on a printed circuit board and is at a first potential. Such a capacitive touch switch can be used, in particular, in a control device for an electronic domestic appliance. The invention also relates to the control device and to a circuit configuration for a capacitive touch switch.

In many electronic appliances, in particular in domestic appliances such as ranges or cookers, cool top platforms, cook tops or hobs, microwave ovens, dishwashers, washing machines, tumble driers and the like, use is often made of touch switches which initiate a specific switching operation in the appliance simply by being touched by a user. In the case of a capacitive touch switch, the latter has a sensor area which, as part of a capacitive sensor element, forms a capacitance together with the user, which changes according to the actuation of the touch switch, that is to say whether a touch switch is touched or not. The sensor area is usually coupled to a circuit configuration through a measuring electrode disposed on a printed circuit board. The circuit configuration feeds a corresponding output signal to an evaluation circuit. The evaluation circuit can determine from the output signal whether or not the capacitive touch switch is actuated.

In this context, German Published, Non-Prosecuted Patent Application DE 10 2005 001 777 A1, filed by the Applicant of the instant application, describes a specific circuit configuration for a capacitive touch switch having a relatively simple construction and at the same time a reliable output signal. Further conventional capacitive touch switches are known to the person skilled in the art from practical experience as well as a multiplicity of documents.

SUMMARY OF THE INVENTION

It is accordingly an object of the invention to provide a capacitive touch switch, a circuit configuration for a capacitive touch switch and a control device for an electronic domestic appliance with at least one capacitive touch switch, which overcome the hereinafore-mentioned disadvantages of the heretofore-known devices of this general type and which make it possible to generate an output signal of the associated circuit configuration that is less sensitive to interference.

With the foregoing and other objects in view there is provided, in accordance with the invention, a capacitive touch switch. The capacitive touch switch comprises a sensor area being part of a capacitive sensor element having a capacitance changing when touched. A measuring electrode is disposed on a printed circuit board, is coupled to the sensor area and is at a first potential. An additional electrode is disposed on the printed circuit board near the measuring electrode, is electrically insulated from the measuring electrode and is at a second potential different from the first potential.

The configuration of an additional electrode that is disposed near the measuring electrode on the printed circuit board in such a way as to be electrically insulated from the measuring electrode and is at a second potential being different from the first potential of the measuring electrode, brings about a shielding of the measuring electrode, which in turn leads to an output signal of an associated sensor circuit which is less sensitive to interference.

In accordance with another feature of the invention, the measuring electrode and the additional electrode are disposed on the same side of the printed circuit board. The additional electrode surrounds the measuring electrode, for example in strip form and/or in areal form.

In accordance with a further feature of the invention, the measuring electrode is disposed on one side of a printed circuit board coated on two sides and the additional electrode is disposed on the other side of the printed circuit board, approximately opposite the measuring electrode. In this case, the additional electrode corresponds to the measuring electrode in terms of its size or is formed with a larger area than the measuring electrode. Furthermore, in this case, the additional electrode may also additionally be disposed on the same side of the printed circuit board as the measuring electrode and may surround the latter there in strip form and/or in areal form.

In accordance with an added feature of the invention, the contour of the additional electrode corresponds to the contour of the measuring electrode. In other words, both electrodes are formed in circular or rectangular fashion, by way of example.

In accordance with an additional feature of the invention, the second potential, which is the potential of the additional electrode, is preferably a potential that is different from ground.

In accordance with yet another feature of the invention, the measuring electrode is electrically conductively connected to the sensor area by an elastic compression element, such as a metallic spring, for example.

In accordance with yet a further feature of the invention, the sensor area is disposed behind an electrically insulating, at least partly light-transmissive, control panel plate such as, for example, a glass ceramic plate of a cool top platform, cook top or hob.

With the objects of the invention in view, there is also provided a circuit configuration for a capacitive touch switch. The circuit configuration comprises a sensor circuit including a first pnp transistor having a base, an emitter and a collector. A first resistor is connected between the base of the first pnp transistor and the measuring electrode of the touch switch described above. A second resistor is connected between the base of the first pnp transistor and an operating voltage from a first voltage source. A third resistor is connected between the emitter of the first pnp transistor and the operating voltage. The collector of the first pnp transistor is connected to the additional electrode of the touch switch described above and receives a pulse voltage from a second voltage source. A second pnp transistor has a base, an emitter and a collector. The base of the second pnp transistor is connected to the emitter of the first pnp transistor. The collector of the second pnp transistor is connected to a reference potential (for example ground). A parallel circuit is connected between the emitter of the second pnp transistor and the operating voltage. The parallel circuit has a fourth resistor and a capacitance. The emitter of the second pnp transistor supplies an output signal of the sensor circuit. An evaluation circuit receives the output signal of the sensor circuit for determining whether or not the touch switch is actuated.

This circuit configuration is based on that in German Published, Non-Prosecuted Patent Application DE 10 2005 001 777 A1, filed by the Applicant of the instant application, in the case of which the capacitive touch switch according to the invention can be used in a particularly advantageous manner. Analogously to the circuit configuration described in German Published, Non-Prosecuted Patent Application DE 10 2005 001 777 A1, in this case as well, the circuit configuration may contain a plurality of such sensor circuits, each for a respective capacitive touch switch of the invention.

With the objects of the invention in view, there is additionally provided a control device for an electronic domestic appliance. The control device comprises at least one capacitive touch switch according to the invention or a circuit configuration according to the invention for at least one capacitive touch switch.

The subject matter of the present invention can advantageously be applied to a control device for an electronic domestic appliance such as a range or cooker, a cool top platform, cook top or hob, a microwave oven, a dishwasher, a washing machine, a tumble drier and the like.

Other features which are considered as characteristic for the invention are set forth in the appended claims.

Although the invention is illustrated and described herein as embodied in a capacitive touch switch, a circuit configuration for a capacitive touch switch and a control device for an electronic domestic appliance with at least one capacitive touch switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a plan view of a capacitive touch switch in accordance with a third exemplary embodiment;

FIG. 5 is a plan view of a capacitive touch switch in accordance with a fourth exemplary embodiment;

FIG. 6 is a fragmentary, partly-sectional plan view of a capacitive touch switch in accordance with a fifth exemplary embodiment;

FIG. 7 is a fragmentary, partly-sectional plan view of a capacitive touch switch in accordance with a sixth exemplary embodiment;

DESCRIPTION OF THE PREFERRED EMBODIMENTS

Figure 1:
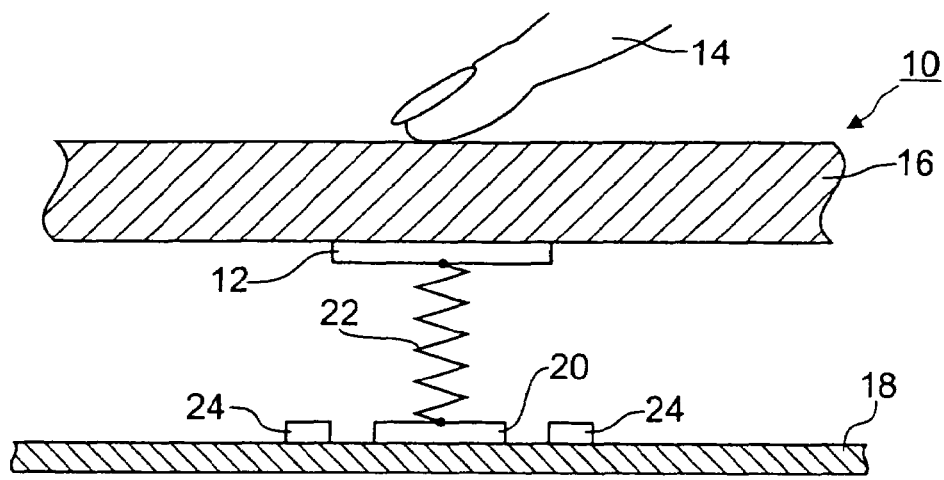
FIG. 1 is a fragmentary, diagrammatic, sectional view illustrating a basic construction of a capacitive touch switch according to the present invention.
Figure 2:
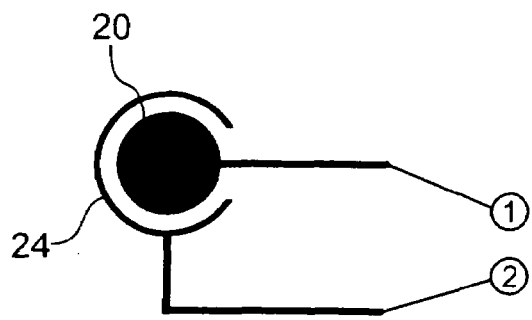
FIG. 2 is a plan view of a capacitive touch switch in accordance with a first exemplary embodiment.
Figure 3:
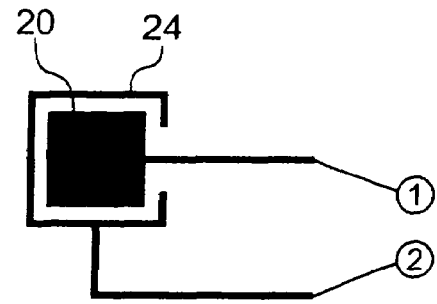
FIG. 3 is a plan view of a capacitive touch switch in accordance with a second exemplary embodiment.

Referring now to the figures of the drawings in detail and first, particularly, to FIG. 1 thereof, there is initially seen a basic construction of a capacitive touch switch of the present invention. Various preferred embodiments of the capacitive touch switch will be described below with reference to FIGS. 2 to 8.

The capacitive touch switch 10 contains a sensor area 12 as part of a capacitive sensor element. The capacitive sensor element, together with a user or his/her finger 14, forms a capacitance Cs, through a control panel plate 16 forming a dielectric, such as, for example, a glass ceramic plate of a cool top platform, cook top, hob or the like. The capacitance Cs of the sensor element is variable according to the actuation of the capacitive touch switch 10, that is to say whether the capacitive touch switch 10 is touched or not. The control panel plate 16 is formed, in a customary manner, in such a way that it is electrically insulating and at least partly light-transmissive, so that the region of the sensor area 12 can be backlit, for example.

A printed circuit board 18 is disposed at a distance behind the control panel plate 16. A measuring electrode 20 is situated on the side of the printed circuit board 18 facing the sensor area 12. The measuring electrode 20 is electrically conductively connected to the sensor area 12 through an elastic compression element 22 such as a metal spring, for example. In this way, on one hand, the sensor area 12 is pressed in close contact against the control panel plate 16 and, on the other hand, the sensor area 12 and the measuring electrode 20 are at the same potential (first potential of the invention).

The measuring electrode 20 is connected to a sensor circuit, which will be described below and which can likewise be mounted on the printed circuit board. The sensor circuit generates an output signal Out in a manner dependent on the capacitance value of the capacitive sensor element. A corresponding evaluation circuit can determine, from the output signal, whether or not the capacitive touch switch 10 is actuated.

Up to this point, the capacitive touch switch 10 corresponds to a conventional touch switch. As is illustrated in FIG. 1, the touch switch 10 furthermore contains an additional electrode 24, which is fitted near the measuring electrode 20, likewise on the printed circuit board 18. The additional electrode 24 is electrically insulated from the Measuring electrode 20 and is at a different potential from the measuring electrode 20 (second potential of the invention). The additional electrode 24 brings about a shielding of the measuring electrode 20 on the printed circuit board 18, which in turn leads to a less disturbed output signal Out of the sensor circuit and thus to a better evaluation capability in the evaluating circuit.

In contrast to the measuring electrode 20, the additional electrode 24 does not form a capacitive sensor element since it is sufficiently spaced apart from the control panel plate 16 and is not connected to a corresponding sensor area. Optionally, an element made of an electrically insulating material may additionally be disposed between the sensor area 12 of the capacitive sensor element and the additional electrode 24.

Various embodiments are provided for the configuration of the measuring electrode 20 and the additional electrode 24. In the case of a printed circuit board 18 coated on one side, the additional electrode 24 and the measuring electrode 20 are disposed on the same side of the printed circuit board 18, preferably on the side facing the sensor area 12. The additional electrode 24 may surround the measuring electrode 20, for example in strip form (see FIGS. 2 and 3) or in areal form (see FIGS. 4 and 5). In this case, the contour of the additional electrode 24 approximately corresponds to the contour of the measuring electrode 20, for example both are formed in a circular, square or rectangular manner.

In the case of the printed circuit board 18 being coated on two sides, the measuring electrode 20 is disposed, for example, on one side of the printed circuit board 18, preferably the side facing the sensor area 12, while the additional electrode 24 is disposed on the other side of the printed circuit board 18 opposite the measuring electrode 20. In this case, the additional electrode 24 may correspond to the measuring electrode 20 in terms of its size (see FIG. 6) or be formed with a larger area than the measuring electrode 20 (see FIG. 7).

Figure 8:
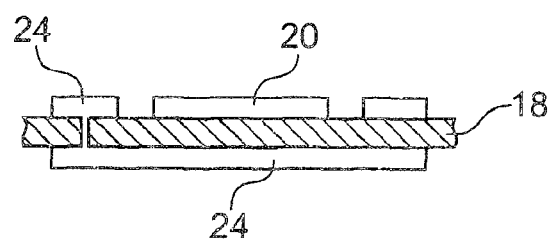
FIG. 8 is a fragmentary, partly-sectional plan view of a capacitive touch switch in accordance with a seventh exemplary embodiment.

As is indicated in FIG. 8, the additional electrode 24 may also be provided both on the same side of the printed circuit board 18 as the measuring electrode 20 and additionally on the other side of the printed circuit board 18 from the measuring electrode 20. That part of the additional electrode 24 on the same side of the printed circuit board 18 is then formed, for example, analogously to one of the exemplary embodiments of FIGS. 2 to 5, while that part of the additional electrode 24 on the other side of the printed circuit board 18 is preferably formed with a larger area than the measuring electrode 20. In this exemplary embodiment of FIG. 8, it is evidently possible to obtain the greatest shielding effect for the measuring electrode 20.

In the exemplary embodiments illustrated in FIGS. 6 to 8, the contour of the additional electrode 24 in each case approximately corresponds to the contour of the measuring electrode 20 as well.

Without being explicitly illustrated, according to the standpoints mentioned above, it is also conceivable to place the additional electrode 24 in more than two planes around the measuring electrode 20 on the printed circuit board 18.

The additional electrode 24, in a simple manner, brings about an improvement of the output signal Out of a sensor circuit connected to the measuring electrode 20. At the same time, the configuration of the additional electrode 24 is independent of the exact configuration of the capacitive sensor element, that is to say for example of possibly used bridging or coupling elements to the control panel plate 16. While the invention has been explained above on the basis of a capacitive-touch switch 10 having a measuring electrode 20 spaced apart from the sensor area 12, it is also possible in the context of the invention to use the measuring electrode 20 itself directly as a sensor area 12, in other words to place the printed circuit board 18 directly behind the control panel plate 16.

As already mentioned, the capacitive touch switch 10 according to one of the embodiments described above is connected to a circuit configuration which detects an actuation of the touch switch 10 and initiates a corresponding switching operation. A preferred exemplary embodiment of such a circuit configuration will now be explained in more detail with reference to FIG. 9. In this case, the circuit configuration of FIG. 9 approximately corresponds to the circuit configuration described in German Published, Non-Prosecuted Patent Application DE 10 2005 001 777 A1.

Figure 9:
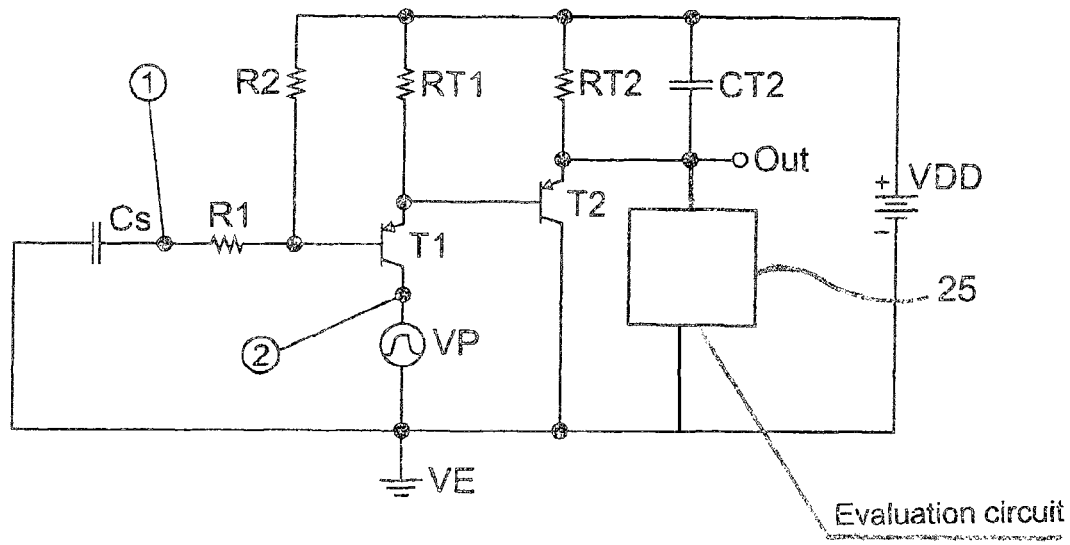
FIG. 9 is a schematic circuit configuration for a capacitive touch switch according to the present invention.

The capacitive sensor element with the capacitance Cs or the measuring electrode 20 coupled thereto, is connected through a first resistor R1 to the base of a first pnp transistor T1, as is indicated by a connection ① in FIG. 9. The base of the first pnp transistor T1 is furthermore connected through a second resistor R2 to an operating voltage VDD. The operating voltage is made available by a first voltage source. The emitter of the first pnp transistor T1 is connected through a third resistor RT1 likewise to the operating voltage VDD.

The collector of the first pnp transistor T1 is connected to a pulse voltage VP made available by a second voltage source, for example in the form of an output pin of a microcontroller. The emitter of the first pnp transistor T1 is furthermore connected to the base of a second pnp transistor T2. The collector of the second pnp transistor T2 is connected to a reference voltage of the circuit configuration, and the emitter of the second pnp transistor T2 is connected through a parallel circuit including a fourth resistor RT2 and a capacitance CT2, to the operating voltage VDD.

The reference voltage of all of the circuit sections as well as the reference potentials of the operating voltage VDD and of the pulse voltage VP, are preferably connected to ground potential VE.

The additional electrode 24 is connected to the collector of the first pnp transistor T1, as is indicated by a connection ② in FIG. 9. The additional electrode 24 is therefore at a potential of the pulse voltage VP, that is to say, in particular, at a different potential than the measuring electrode 20. It has become clear in this case that it is advantageous if the additional electrode 24 is not connected to the ground potential VE, but rather to the pulse voltage VP.

The output signal Out of the sensor circuit is tapped off at the emitter of the second pnp transmitter T2 and fed to the evaluation circuit 25, that is to say for example to an ADC input of a microcontroller.

Circuit configurations with a plurality of sensor circuits, which are in each case assigned to one of a plurality of capacitive touch switches, can be constructed in a simple manner on the basis of this circuit configuration of FIG. 9 for a capacitive touch switch 10.

Although the description of the circuit of FIG. 9 is complete, since the construction and the functioning of the circuit configuration of FIG. 9 as well as the construction of the circuit configuration with a plurality of sensor circuits, are thoroughly explained in German Published, Non-Prosecuted Patent Application DE 10 2005 001 777 A1, filed by the Applicant of the instant application, a more detailed description is dispensed with at this juncture. Instead, reference is made in this regard to the entire contents of German Published, Non-Prosecuted Patent Application DE 10 2005 001 777 A1, which is incorporated herein by reference.

The capacitive touch switch having the above-described construction can advantageously be applied in a control device for an electronic domestic appliance, such as, for example, a range or cooker, a cool top platform, cook top or hob, a microwave oven, a dishwasher, a washing machine, a tumble drier and the like.

I claim:

1. A capacitive touch switch and circuit configuration, comprising:
   a sensor circuit supplying an output signal, said sensor circuit including:
   a capacitive touch switch having a measuring electrode and an additional electrode;
   a first voltage source for supplying an operating voltage having positive and negative poles;
   a first pnp transistor having a base, an emitter and a collector, a first resistor connected between the base of said first pnp transistor and said measuring electrode, a second resistor connected between the base of said first pnp transistor and the positive pole of the operating voltage, and a third resistor connected between the emitter of said first pnp transistor and the positive pole of the operating voltage, the collector of said first pnp transistor being connected to said additional electrode;

a second voltage source for supplying a pulse voltage, said second voltage source connected between the collector of said first pnp transistor and a reference potential connected to the negative pole of the operating voltage;

a second pnp transistor having a base, an emitter and a collector, the base of said second pnp transistor being connected with the emitter of said first pnp transistor, the collector of said second pnp transistor being connected with the reference potential, and a parallel circuit connected between the emitter of said second pnp transistor and the positive pole of the operating voltage, said parallel circuit having a fourth resistor and a capacitance;

the output signal of said sensor circuit being present between the emitter of said second pnp transistor and the reference potential connected to the negative pole of the operating voltage; and an evaluation circuit receiving the output signal of said sensor circuit for determining whether or not said capacitive touch switch is actuated.

2. The configuration according to claim 1, wherein said capacitive touch switch includes:

a sensor area; and a printed circuit board;

said measuring electrode being disposed on said printed circuit board, coupled to said sensor area and at a first potential;

said additional electrode being disposed on said printed circuit board close to said measuring electrode, electrically insulated from said measuring electrode and at a second potential differing from the first potential.

3. The configuration according to claim 2, wherein said additional electrode surrounds said measuring electrode in at least one of strip or areal form.

4. The configuration according to claim 2, wherein said measuring electrode is disposed on one side of said printed circuit board and said additional electrode is disposed on another side of said printed circuit board opposite said measuring electrode.

5. The configuration according to claim 4, wherein said additional electrode has an area equal to or larger than said measuring electrode.

6. The configuration according to claim 5, wherein said additional electrode is additionally disposed on the same side of said printed circuit board as said measuring electrode and surrounds said measuring electrode in one of strip or areal form.

7. The configuration according to claim 4, wherein said additional electrode is additionally disposed on the same side of said printed circuit board as said measuring electrode and surrounds said measuring electrode in one of strip or areal form.

8. The configuration according to claim 2, wherein said additional electrode and said measuring electrode have corresponding contours.

9. The configuration according to claim 2, which further comprises an elastic compression element electrically conductively connecting said measuring electrode to said sensor area.

10. The configuration according to claim 2, which further comprises an electrically insulating, at least partly light-transmissive control panel plate behind which said sensor area is disposed.

11. The configuration according to claim 10, wherein said sensor area is said measuring electrode and is disposed directly behind said control panel plate.

12. The configuration according to claim 1, wherein said second potential of said additional electrode is different from ground.

13. A control device for an electronic domestic appliance, the control device comprising said sensor circuit and at least one capacitive touch switch according to claim 1.

* * * * *